United States Patent [19]

Mizuno

[11] Patent Number: 5,198,396
[45] Date of Patent: Mar. 30, 1993

[54] MICROWAVE DIELECTRIC CERAMIC COMPOSITION

[75] Inventor: Fumio Mizuno, Nagoya, Japan

[73] Assignee: NGK Spark Plug Company, Ltd., Aichi, Japan

[21] Appl. No.: 825,078

[22] Filed: Jan. 24, 1992

[30] Foreign Application Priority Data

Jan. 26, 1991 [JP] Japan .................................. 3-25290

[51] Int. Cl.$^5$ ............................................ C04B 35/46
[52] U.S. Cl. ...................................... 501/138; 423/598
[58] Field of Search ......................... 501/138; 423/598

[56] References Cited

U.S. PATENT DOCUMENTS 5,084,424  1/1992  Abe et al. ............................. 501/138
5,086,021  2/1992  Sasake et al. ........................ 501/138

FOREIGN PATENT DOCUMENTS 0689382  3/1953  United Kingdom ................ 501/138
0835961  5/1960  United Kingdom ................ 501/138

*Primary Examiner*—Mark L. Bell
*Assistant Examiner*—Deborah Jones
*Attorney, Agent, or Firm*—Finnegan, Henderson, Farabow, Garrett & Dunner

[57] ABSTRACT

Disclosed herein is a microwave dielectric ceramic composition which comprises a compound represented by the formula $BaO \cdot xTiO_2$ (where $3.7 \leq x \leq 4.5$) which is incorporated with 1.0–10 wt. % $Ba_3Ti_{12}Zn_7O_{34}$ and 2–8 wt. % $Ta_2O_5$. It has well-balanced performance owing to a Q value not less than 8000 (at 4.5 GHz), a relative permittivity $\epsilon$ not less than 31, and a practical temperature coefficient in the range of $-15$ to $+10$ ppm/°C. It may be further incorporated with 0.1–0.4 wt. % $MnO_2$ for improved sinterability in addition to the above-mentioned performance.

9 Claims, No Drawings

MICROWAVE DIELECTRIC CERAMIC COMPOSITION

BACKGROUND OF THE INVENTION

1. Field of industrial application

The present invention relates to a microwave dielectric ceramic composition, more particularly, to a microwave dielectric ceramic composition which has a high Q value and relative permittivity and also has a temperature coefficient within the range of practical use. The present invention is also concerned with a microwave dielectric ceramic composition which can be produced easily by firing. The microwave dielectric ceramic composition of the present invention will be used for dielectric resonators in the microwave frequency region, microwave IC substrates, and impedance matching for microwave circuits.

2. Prior art

A microwave dielectric ceramic composition (simply referred to as a dielectric ceramic composition hereinafter) tends to increase in dielectric loss with the increasing frequency. Therefore, there is a demand for a dielectric ceramic composition which has a high Q value in the frequency region of microwave.

Known dielectric ceramic compositions include those of $ZrO_2$—$SnO_2$—$TiO_2$ system and $BaO$—$TiO_2$ system, sometimes with a part thereof replaced by any other element. (See Japanese Patent Publication No. 37807/1989.) These known products, however, suffer from a disadvantage of low Q and relative permittivity, undesirable temperature coefficient, and poor sinterability. In addition, there is a demand for a new dielectric ceramic composition which is different in components from conventional ones and can be easily produced with good sinterability.

SUMMARY OF THE INVENTION

Object of the invention

The present invention was completed with the foregoing in mind. It is an object of the present invention to provide a dielectric ceramic composition which has a high Q value and relative permittivity and also has a temperature coefficient of resonance frequency within the range of practical use. It is another object of the present invention to provide a dielectric ceramic composition which can be produced easily by firing.

Features of the invention

The present inventors investigated the dielectric ceramic compositions of Ba—Zn—Ta—Ti—O system which satisfy all of the following requirements, and the results of the investigation led to the present invention.
(1) Q value: generally not less than 5000, particularly not less than 8000 (at 4.5 GHz)
(2) Relative permittivity $\epsilon r$: not less than 30
(3) Temperature coefficient $\tau f$: $-20$ to $+20$ ppm/°C. particularly $-15$ to $+10$ ppm/°C.
(4) Sinterability: good; to be capable of firing satisfactorily at 1300° C. or below.

The first invention is embodied in a dielectric ceramic composition which comprises a compound represented by the formula $BaO \cdot xTiO_2$ (where $3.7 \leq x \leq 4.5$) which is incorporated with 1.0–10 wt % $Ba_3Ti_{12}Zn_7O_{34}$ and 2–8 wt % $Ta_2O_5$. The third invention is embodied in a dielectric ceramic composition as defined in the first invention, which is further incorporated with 0.1–0.4 wt % $MnO_2$.

With a value of x smaller than 3.7, the dielectric ceramic composition has an undesirably low relative permittivity $\epsilon r$; with a value of x greater than 4.5, the dielectric ceramic composition has an undesirably low Q value.

$Ba_3Ti_{12}Zn_7O_{34}$ is added to shift the temperature coefficient $\tau f$ of resonance frequency to the plus side. Without this compound, the dielectric ceramic composition would have a temperature coefficient $\tau f$ of resonance frequency which is high in the minus side. An excess amount of this compound more than 10 wt % will cause the temperature coefficient $\tau f$ to increase in the plus side and also cause both the Q value and relative permittivity $\epsilon r$ to decrease.

$Ta_2O_5$ is added to increase the Q value. It takes effect when added in an amount more than 2 wt %. However, it lowers the Q value when added in an excess amount more than 8 wt %.

$MnO_2$ is added to improve the sinterability. An amount of 0.1–0.4 wt % permits sintering at low temperatures (1250°–1300° C.). With any amount outside the specified range, the ceramic composition needs high temperatures (above 1300° C.) for sintering.

In the second, fourth, and sixth inventions, the dielectric ceramic composition comprises $BaO \cdot xTiO_2$ in which $4.0 \leq x \leq 4.4$, so that it has a temperature coefficient of $-5$ to $+5$ ppm/°C. (or close to zero).

In the fifth invention, the dielectric ceramic composition is incorporated with 4.0–10 wt % $Ba_3Ti_{12}Zn_7O_{34}$, so that it has a temperature coefficient of $-10$ to $+9$ ppm/°C. (or close to zero).

The dielectric ceramic composition of the present invention may be produced by firing the raw materials mixed as prescribed. For example, the production process starts with the synthesis of $BaO \cdot xTiO_2$ powder having a desired value of x from a substance which becomes $BaO$ on firing and $TiO_2$ powder, and the $BaO \cdot xTiO_2$ powder is incorporated with $Ba_3Ti_{12}Zn_7O_{34}$, $MnO_2$, and $Ta_2O_5$ powder in prescribed amounts. The mixture is finally sintered.

Effect of the invention

As mentioned above, the dielectric ceramic composition of the present invention has a high Q value and relative permittivity and a temperature coefficient $\tau f$ in the range of practical use. Because of this balanced performance, it is of great practical use.

Moreover, the dielectric ceramic composition incorporated with 0.1–0.4 wt % $MnO_2$ has good sinterability on producing it in addition to the above-mentioned balanced performance.

DETAILED DESCRIPTION OF THE INVENTION

Examples

The invention will be described in more detail with reference to the following examples.

(1) Preparation of samples

As much $BaCO_3$ powder (99.9% pure) and $TiO_2$ powder as required were crushed and mixed using a dry mixer, and the mixture was heated at 1000° C. for 6 hours in an atmosphere of oxygen to give $BaO \cdot xTiO_2$ powder (where $3.7 \leq x \leq 4.5$).

Similarly $BaCO_3$ powder (99.9% pure), $TiO_2$ powder, and ZnO powder were crushed and mixed in a molar ratio of Ba:Ti:Zn = 3:12:7 using a dry mixer, and the mixture was heated at 1250° C. for 10 hours in an atmosphere of oxygen to give $Ba_3Ti_{12}Zn_7O_{34}$ powder.

The thus obtained BaO·xTiO$_2$ powder was incorporated with Ba$_3$Ti$_{12}$Zn$_7$O$_{34}$ powder, MnO$_2$ powder, and Ta$_2$O$_5$ powder according to the formulations shown in Tables 1 to 4. The resulting mixture was comminuted and mixed using a dry mixer and further comminuted together with an adequate amount of organic binder and water using a ball mill containing alumina balls 30 mm in diameter. The mixture was granulated by spray drying. The granules were formed into disks (18 mm in diameter and 15 mm thick) by pressing under a pressure of 1500 kg/cm$^2$.

The green compacts were fired at 1250°–1350° C. for 10 hours in the atmosphere. The fired products were finally finished by grinding into disks (12 mm in diameter and 10 mm thick) as dielectric samples.

The samples, which were fired at sintering temperature where relative permittivity $\epsilon r$ was lowest, were tested for Q value (1/tan $\delta$), relative permittivity $\epsilon r$, and temperature coefficient $\tau f$ of resonance frequency. Q and $\epsilon r$ were measured by the dielectric resonator method, and $\tau f$ was calculated from the equation $\tau f = -\frac{1}{2}\tau\epsilon - \alpha$ in the range from $-30°$ C. to 80° C. The resonance frequency is about 4.5 GHz. The coefficient of linear expansion ($\alpha$) is 9.5–11 ppm/°C. The $\tau\epsilon$ is the temperature coefficient of $\epsilon r$.

(2) Evaluation of performance

The characteristic properties of the dielectric samples are shown in Tables 1 to 4, in which unsatisfactory results (with the Q value lower than 5000 and the temperature coefficient smaller than $-20$) are marked with * and slightly poor results (although practical) are marked with #. Those samples which had to be fired at a temperature higher than 1300° C. for satisfactory sintering are marked with x. Those samples which are fired at a temperature not more than 1300° C. for satisfactory sintering are marked with ◯. Those samples which are outside the scope of the present invention are marked with x in the column of "Overall rating", and those samples which are either inside or outside of the scope of the present invention or poor in sinterability are marked with Δ.

TABLE 1

| Sample No. | Value of x | Additives (wt %) Ba$_3$Ti$_{12}$Zn$_7$O$_{34}$ | MnO$_2$ | Ta$_2$O$_5$ | Firing temperature (°C.) | Relative permittivity ($\epsilon_r$) | Q value (= 1/tan $\delta$) at 4.5 GHz | Temperature coefficient ($\tau_f$) ppm/°C. | Sinterability | Overall rating |
|---|---|---|---|---|---|---|---|---|---|---|
| 1 | *3.6 | 5 | 0.3 | 4 | 1250 | 31.0 | 7800 | −12 | ◯ | X |
| 2 | 3.7 | 5 | 0.3 | 4 | 1250 | 34.2 | 9600 | −10 | ◯ | ◯ |
| 3 | 3.8 | 5 | 0.3 | 4 | 1250 | 34.6 | 9500 | −8 | ◯ | ◯ |
| 4 | 3.9 | 5 | 0.3 | 4 | 1250 | 35.1 | 9200 | −5 | ◯ | ◯ |
| 5 | 4.0 | 5 | 0.3 | 4 | 1250 | 35.5 | 9000 | −3 | ◯ | ◯ |
| 6 | 4.1 | 5 | 0.3 | 4 | 1250 | 36.0 | 9100 | 1 | ◯ | ◯ |
| 7 | 4.2 | 5 | 0.3 | 4 | 1250 | 36.7 | 9800 | 1 | ◯ | ◯ |
| 8 | 4.3 | 5 | 0.3 | 4 | 1250 | 37.1 | 9000 | 2 | ◯ | ◯ |
| 9 | 4.4 | 5 | 0.3 | 4 | 1250 | 37.5 | 9300 | 3 | ◯ | ◯ |
| 10 | 4.5 | 5 | 0.3 | 4 | 1250 | 38.2 | 8600 | 5 | ◯ | ◯ |
| 11 | *4.6 | 5 | 0.3 | 4 | 1250 | 34.7 | *4200 | 3 | X | X |
| 12 | 3.8 | *0 | 0.3 | 4 | 1260 | 37.2 | 8400 | *−24 | ◯ | X |

TABLE 2

| Sample No. | Value of x | Additives (wt %) Ba$_3$Ti$_{12}$Zn$_7$O$_{34}$ | MnO$_2$ | Ta$_2$O$_5$ | Firing temperature (°C.) | Relative permittivity ($\epsilon_r$) | Q value (= 1/tan $\delta$) at 4.5 GHz | Temperature coefficient ($\tau_f$) ppm/°C. | Sinterability | Overall rating |
|---|---|---|---|---|---|---|---|---|---|---|
| 13 | 3.8 | 1 | 0.3 | 4 | 1260 | 36.5 | 8900 | −15 | ◯ | ◯ |
| 14 | 3.8 | 2 | 0.3 | 4 | 1260 | 35.8 | 9200 | −12 | ◯ | ◯ |
| 15 | 3.8 | 4 | 0.3 | 4 | 1260 | 35.0 | 9100 | −10 | ◯ | ◯ |
| 16 | 3.8 | 6 | 0.3 | 4 | 1260 | 34.0 | 9400 | −5 | ◯ | ◯ |
| 17 | 3.8 | 8 | 0.3 | 4 | 1260 | 33.5 | 8200 | 0 | ◯ | ◯ |
| 18 | 3.8 | 10 | 0.3 | 4 | 1260 | 33.0 | #7800 | 6 | Δ | ◯ |
| 19 | 3.8 | *11 | 0.3 | 4 | 1260 | 31.7 | *4900 | 12 | Δ | X |
| 20 | 4.2 | *0 | 0.3 | 4 | 1290 | 39.1 | 10200 | *−21 | ◯ | X |
| 21 | 4.2 | 1 | 0.3 | 4 | 1290 | 39.0 | 11000 | −16 | ◯ | ◯ |
| 22 | 4.2 | 2 | 0.3 | 4 | 1290 | 38.8 | 11000 | −12 | ◯ | ◯ |
| 23 | 4.2 | 4 | 0.3 | 4 | 1290 | 38.5 | 11000 | −6 | ◯ | ◯ |
| 24 | 4.2 | 6 | 0.3 | 4 | 1290 | 38.2 | 10300 | −2 | ◯ | ◯ |

TABLE 3

| Sample No. | Value of x | Additives (wt %) Ba$_3$Ti$_{12}$Zn$_7$O$_{34}$ | MnO$_2$ | Ta$_2$O$_5$ | Firing temperature (°C.) | Relative permittivity ($\epsilon_r$) | Q value (= 1/tan $\delta$) at 4.5 GHz | Temperature coefficient ($\tau_f$) ppm/°C. | Sinterability | Overall rating |
|---|---|---|---|---|---|---|---|---|---|---|
| 25 | 4.2 | 8 | 0.3 | 4 | 1290 | 37.7 | 9400 | 2 | ◯ | ◯ |
| 26 | 4.2 | 10 | 0.3 | 4 | 1290 | 37.4 | 9200 | 9 | ◯ | ◯ |
| 27 | 4.2 | 11 | 0.3 | 4 | 1290 | 37.0 | 9100 | #11 | ◯ | Δ |
| 28 | 3.8 | 5 | *0 | 4 | 1310 | 34.5 | 9200 | −5 | X | Δ |
| 29 | 3.8 | 5 | 0.1 | 4 | 1260 | 34.5 | 9200 | −4 | ◯ | ◯ |
| 30 | 4.2 | 5 | *0 | 4 | 1330 | 38.7 | 11000 | −4 | X | Δ |
| 31 | 4.2 | 5 | 0.1 | 4 | 1280 | 38.6 | 10500 | −4 | ◯ | ◯ |
| 32 | 3.8 | 5 | 0.4 | 4 | 1240 | 34.4 | 9200 | −5 | ◯ | ◯ |
| 33 | 3.8 | 5 | *0.5 | 4 | 1310 | 34.1 | #6800 | −7 | X | Δ |
| 34 | 4.2 | 5 | 0.4 | 4 | 1290 | 38.5 | 10200 | −4 | ◯ | ◯ |
| 35 | 4.2 | 5 | *0.5 | 4 | 1310 | 38.4 | 9400 | −4 | X | Δ |
| 36 | 3.8 | 5 | 0.3 | *1 | 1250 | 34.3 | *4800 | −5 | ◯ | X |

TABLE 4

| Sample No. | Value of x | Additives (wt %) Ba₃Ti₁₂Zn₇O₃₄ | MnO₂ | Ta₂O₅ | Firing temperature (°C.) | Relative permittivity ($\epsilon_r$) | Q value (= 1/tan δ) at 4.5 GHZ | Temperature coefficient ($\tau_f$) ppm/°C. | Sinterability | Overall rating |
|---|---|---|---|---|---|---|---|---|---|---|
| 37 | 3.8 | 5 | 0.3 | 2 | 1250 | 34.3 | #5800 | −4 | ○ | △ |
| 38 | 3.8 | 5 | 0.3 | 6 | 1250 | 34.2 | 9400 | −5 | ○ | ○ |
| 39 | 3.8 | 5 | 0.3 | 8 | 1250 | 34.1 | 8400 | −5 | ○ | ○ |
| 40 | 3.8 | 5 | 0.3 | *9 | 1250 | 33.9 | *4800 | −5 | ○ | X |
| 41 | 4.2 | 5 | 0.3 | *1 | 1290 | 38.4 | *4200 | −3 | ○ | X |
| 42 | 4.2 | 5 | 0.3 | 2 | 1290 | 38.5 | #6200 | −4 | ○ | △ |
| 43 | 4.2 | 5 | 0.3 | 6 | 1290 | 38.4 | 11200 | −3 | ○ | ○ |
| 44 | 4.2 | 5 | 0.3 | 8 | 1290 | 38.4 | 9400 | −4 | ○ | ○ |
| 45 | 4.2 | 5 | 0.3 | *9 | 1290 | 38.5 | *4600 | −7 | ○ | X |
| 46 | 4.4 | 5 | *0 | 4 | 1330 | 37.8 | 9700 | 0 | △ | △ |
| 47 | *4.6 | 5 | *0 | 4 | 1330 | 36.7 | *4600 | 5 | X | X |
| 48 | *3.6 | 5 | *0 | 4 | 1310 | 30.7 | 6000 | −15 | X | X |

Tables 1 to 4 show the following. Sample No. 1 prepared from BaO·xTiO₂ in which x is 3.6 has a low $\epsilon_r$ value of 31.0. Sample No. 11 prepared from BaO·xTiO₂ in which x is as great as 4.6 has a low Q value of 4200. Samples Nos. 2 to 10 prepared from BaO·xTiO₂ in which x is 3.7–4.5 have adequate $\epsilon_r$, Q, and $\tau_f$ values which are well balanced.

Samples vary in $\tau_f$ values depending on x of BaO·xTiO₂. Samples Nos. 5–9 (x; 4.0–4.4) of samples Nos. 1~10 (x; 3.6–4.6, containing MnO₂), have $\tau_f$ values of from −3 to +3 ppm/°C., and Samples Nos. 28, 30, 46–48 (x; 3.6–4.6, not containing MnO₂) prepared from BaO·xTiO₂ in which x is 4.0–4.4 have $\tau_f$ values of from −4.5 to 0 ppm/°C. In other words, BaO·xTiO₂ in which x is 4.0–4.4 gives rise to preferred samples having $\tau_f$ values close to 0 ppm/°C.

Samples Nos. 12 and 20 (not containing Ba₃Ti₁₂Zn₇O₃₄) have great negative $\tau_f$ values of −24 and −21 ppm/°C. respectively. On the other hand, sample No. 19 (containing 11 wt % Ba₃Ti₁₂Zn₇O₃₄) has a Q value of 4900, a slightly low $\epsilon_r$ value of 31.7, and a great positive $\tau_f$ value of +12 ppm/°C. They all have nonlinear $\tau_f$ values. Thus it is impossible for them to have a properly controlled $\tau_f$ value.

The better performance of samples is achieved with Ba₃Ti₁₂Zn₇O₃₄ in an amount from 4.0 to 10 wt %. For example, samples Nos. 5–18 have $\tau_f$ values of −10 to +6 ppm/°C. (which are close to zero), and samples Nos. 23–26 have $\tau_f$ values of −6 to +9 ppm/°C. (which are close to zero). In the case where the amount of Ba₃Ti₁₂Zn₇O₃₄ is outside the specified range, as in samples Nos. 13, 14, 19, 21, 22, and 27, the desired performance is not achieved.

The content of Ta₂O₅ affects Q values. Samples Nos. 36 and 41, containing 1 wt % Ta₂O₅, gave a small Q value of 4800 and 4200, respectively. Samples Nos. 40 and 45, containing 9 wt % Ta₂O₅, also gave a small Q value of 4800 and 4600, respectively.

The content of MnO₂ affects sinterability. Samples Nos. 28 and 30, not containing MnO₂, need firing at temperatures higher than 1300° C. for complete sintering (production of high-density sintering body). Samples Nos. 33 and 35, containing 0.5 wt % MnO₂, are poor in sinter-ability.

Except for the above-mentioned samples, samples Nos. 2–10, 13–18, 21–26, 29, 31, 32, 34, 37–39, 42–44, which contain BaO·xTiO₂ wherein 3.7≦x≦4.5, 1.0–10 wt % Ba₃Ti₁₂Zn₇O₃₄, 2–8 wt % Ta₂O₅, and 0.2–0.4 wt % MnO₂, are superior in all of relative permittivity, Q value, temperature coefficient, and sinterability and hence have well-balanced performance. Samples Nos. 28 and 30, which contain all the components in amounts as specified above except MnO₂, which contain BaO·xTiO₂ wherein 3.7≦x≦4.5, 1.0–10 wt % Ba₃Ti₁₂Zn₇O₃₄ and 2–8 wt % Ta₂O₅, have good performance for practical use except sinterability.

The above-mentioned embodiments may be modified within the scope of the invention according to the intended object and application. In other words, the calcining and firing temperatures may be properly changed. In addition, BaCO₃ as the starting material for BaO may be replace by a peroxide, hydroxide, or nitrate.

What is claimed is:

1. A microwave dielectric ceramic composition which comprises a compound represented by the formula BaO·xTiO₂ where 3.7≦x≦4.5 which is incorporated with 1.0–10 wt % Ba₃Ti₁₂Zn₇O₃₄ and 2–8 wt % Ta₂O₅.

2. A microwave dielectric ceramic composition as claimed in claim 1, wherein the formula BaO·xTiO₂ is defined by 4.0≦x≦4.4.

3. A microwave dielectric ceramic composition which comprises a compound represented by the formula BaO·xTiO₂ where 3.7≦x≦4.5 which is incorporated with 1.0–10 wt % Ba₃Ti₁₂Zn₇O₃₄, 2–8 wt % Ta₂O₅, and 0.1–0.4 wt % MnO₂.

4. A microwave dielectric ceramic composition as claimed in claim 3, wherein the formula BaO·xTiO₂ is defined by 4.0≦x≦4.4.

5. A microwave dielectric ceramic composition as claimed in claim 3, wherein the amount of Ba₃Ti₁₂Zn₇O₃₄ is 4.0–10 wt %.

6. A microwave dielectric ceramic composition as claimed in claim 3, wherein the formula BaO·xTiO₂ is defined by 4.0≦x≦4.4 and the amount of Ba₃Ti₁₂Zn₇O₃₄ is 4.0–10 wt %.

7. A microwave dielectric ceramic composition as claimed in claim 1 or 3, which has a Q value not less than 8000 at 4.5 GHz, a relative permittivity $\epsilon_r$ not less than 31, and a temperature coefficient in the range of −16 to +12 ppm/°C.

8. A microwave dielectric ceramic composition as claimed in claim 2, 4, or 6, which has a Q value not less than 8000 at 4.5 GHz, a relative permittivity $\epsilon_r$ not less than 31, and a temperature coefficient of resonance frequency in the range of −5 to +5 ppm/°C.

9. A microwave dielectric ceramic composition as claimed in claim 5, which has a Q value not less than 8000 at 4.5 GHz, a relative permittivity $\epsilon_r$ not less than 31, and a temperature coefficient of resonance frequency in the range of −10 to +9 ppm/°C.

* * * * *